United States Patent [19]

Darolia et al.

[11] Patent Number: 4,849,030
[45] Date of Patent: Jul. 18, 1989

[54] DISPERSION STRENGTHENED SINGLE CRYSTAL ALLOYS AND METHOD

[75] Inventors: Ramgopal Darolia; David M. Matey, both of West Chester, Ohio

[73] Assignee: General Electric Company, Cincinnati, Ohio

[21] Appl. No.: 113,413

[22] Filed: Oct. 27, 1987

Related U.S. Application Data

[63] Continuation of Ser. No. 871,977, Jun. 9, 1986, abandoned.

[51] Int. Cl.⁴ .............................................. C22F 1/10
[52] U.S. Cl. ...................................... 148/3; 148/162; 148/404; 148/410
[58] Field of Search .................. 148/404, 3, 162, 409, 148/410

[56] References Cited

U.S. PATENT DOCUMENTS 3,494,709  2/1970  Piearcey .............................. 148/404

Primary Examiner—R. Dean
Attorney, Agent, or Firm—Stephen S. Strunck; Derek P. Lawrence

[57] ABSTRACT

The present invention is directed to single crystal superalloys of eutectic or near-eutectic composition. The high temperature mechanical properties of the superalloys of the invention are improved by precipitation of dispersoids of a phase of the eutectic into the single crystal matrix during thermal treatment subsequent to solidification of the single crystal from the superalloy melt. During solidification, the growth of the dispersed phase is suppressed.

27 Claims, 4 Drawing Sheets

γ + γ'
MATRIX

Ta C
DISPERSOIDS

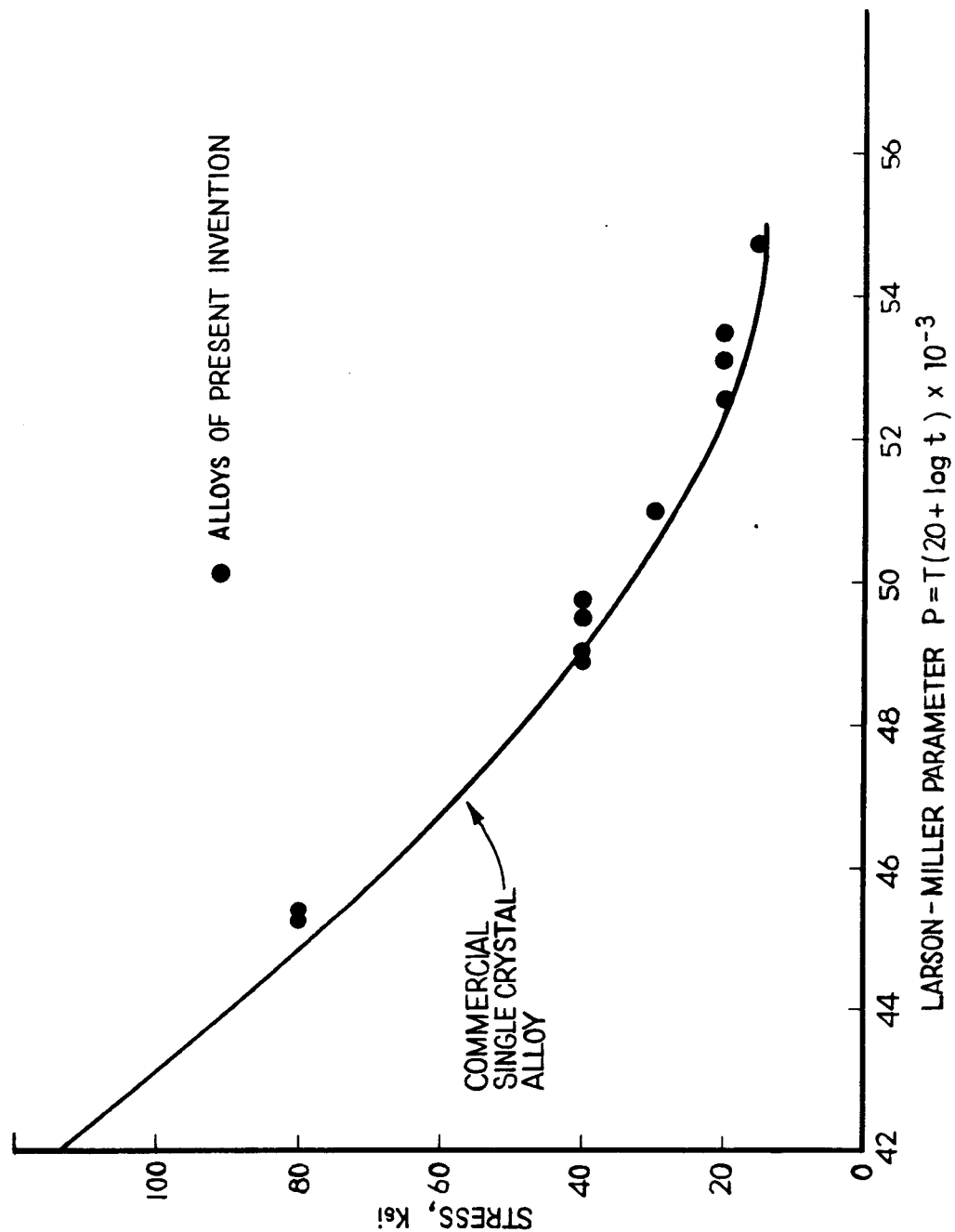

DISPERSION STRENGTHENED SINGLE CRYSTAL ALLOYS AND METHOD

This is a continuation of application Ser. No. 871,977 filed June 9, 1986, abandoned.

SUMMARY OF THE INVENTION

The present invention is directed to single crystal superalloys of eutectic or near-eutectic composition. The high temperature mechanical properties of the superalloys of the invention are improved by precipitation of dispersoids of a phase of the eutectic into the single crystal matrix during thermal treatment subsequent to solidification of the single crystal from the superalloy melt. During solidification, the growth of the dispersed phase is suppressed.

BACKGROUND OF THE INVENTION

The efficiency of gas turbine engines depends significantly on the operating temperature of the various engine components with increased operating temperatures resulting in increased efficiencies. The search for increased efficiencies has led to and continues to result in the development of heat-resistant nickel-base superalloys which can withstand increasingly high temperatures yet maintain their basic material properties.

The casting processes used with early generations of iron, cobalt and nickel-base superalloys, commonly referred to as conventionally cast superalloys, generally produced gas turbine engine components whose microstructures consisted of a multitude of equiaxed grains of random crystallographic orientation with grain boundaries between the grains.

Improvements in the ability of conventional superalloys to withstand higher temperatures without impairing other needed qualities, such as strength and oxidation resistance, was achieved through alloy development and the introduction of improved processing techniques. Those improvements followed from findings that the strength of such superalloys, and other important characteristics, were dependent upon the strengths of the grain boundaries. To strengthen such conventional superalloys, initial efforts were aimed at strengthening the grain boundaries by the addition of various grain boundary strengthening elements such as carbon (C), boron (B), zironcium (Zr), and hafnium (Hf) and by the removal of deleterious impurities such as lead (Pb) or bismuth (Bi) which tended to segregate at and weaken the grain boundaries.

Efforts to further increase strength levels in conventional nickel-base superalloys by preferentially orienting the grain boundaries parallel to the growth, i.e., solidification direction, were subsequently initiated. Preferential orientation of the grains generally results in a grain structure of long, slender columnar grains oriented substantially parallel to a single crystallographic direction and minimizes or eliminates grain boundaries transverse to the growth direction. The process used, directional solidification (DS), is described, for instance, in U.S. Pat. No. 3,897,815 - Smashey. The disclosures of all the U.S. Pat. Nos. referred to herein are hereby incorporated herein by reference.

Compared with conventionally cast superalloy articles, directionally solidified (DS'd) articles exhibited increased strength when the columnar grains were aligned parallel to both the solidification direction and the principal stress axis due to the elimination or minimization of grain boundaries transverse to the principal stress axis. In addition, DS provided an increase in other properties, such as ductility and resistance to low cycle fatigue, due to the preferred grain orientation. However, reduced strength and ductility properties still existed in the transverse directions due to the presence of longitudinal columnar grain boundaries in such DS'd articles. Additions of Hf, C, B, and Zr were utilized to improve the transverse grain boundary strength of such alloys as was done previously in conventional equiaxed nickel-base superalloys. However, large additions of these elements acted as melting point depressants and resulted in limitations in heat treatment which did not allow the development of desired microstructures for maximum strengths within such directionally solidified superalloys.

It had been recognized for some time that articles could be cast in various shapes as a single crystal, thus eliminating grain boundaries altogether. A logical step then was to modify the DS process to enable solidification of superalloy articles as single crystals to elimiate longitudinally extending high angle grain boundaries previously found in DS'd articles.

There then began continuing efforts in the development of processes for the casting of single crystal articles, such as blades and vanes, useful in gas turbine engines and for superalloys particularly tailored to such casting processes and such applications. Examples of such process and alloy development are found, for example, in U.S. Pat. Nos. 3,494,709-Piearcey; 3,915,761-Tschinkel et al.; 4,116,723-Gell et al.; 4,209,348-Duhl et al.; 4,453,588-Goulette et al.; and 4,459,160-Meetham et al.

Another type of alloy having high strength at elevated temperatures, combined with good resistance to hot corrosion and oxidation, and, therefore, useful as articles, particularly blades and vanes, for gas turbine engines are the eutectic alloys. Suitable eutectic alloys may be cast using a directional solidification method, sometimes referred to as planar front solidification, so as to produce columnar grained, polycrystalline, anisotropic composite articles having a superalloy matrix with reinforcing fibers embedded therein which are aligned substantially parallel to the solidification direction.

Illustratively, in the nickel-base eutectic superalloy described in U.S. Pat. No. 4,305,761-Bruch et al., aligned eutectic reinforcing metallic carbide fibers are embedded in a gamma-gamma prime matrix in which the gamma prime strengthening phase is dispersed in the gamma phase. The reinforcing metallic carbide (MC or monocarbide) fibers are those of which the metal preferably is principally Ta, but can include, in addition, such metals as Mo, W, V, Re and Cb as may be included in the alloy. Other nickel-base eutectic superalloys are described, for example, in U.S. Pat. Nos. 4,284,430-Henry and 4,292,076-Gigliotti et al.

In the case of the nickel-aluminum-molybdenum-tantalum alloy described in U.S. Pat. No. 4,288,259-Pearson et al., the structure comprises a gamma prime [$Ni_3$(Al,Ta)]matrix and an alpha body centered cubic (Mo) second phase in fibrous form. In U.S. Pat. No. 3,985,582-Bibring et al., there are described eutectic superalloy articles wherein carbide fibers are embedded in a columnar grained, polycrystalline matrix of a complex refractory superalloy and wherein the matrix also contains a fine precipitates of carbide of the same nature as the fibers.

One significant impediment to the use of eutectic superalloys in gas turbine engine applications is their high cost associated with the near equilibrium, generally very slow, growth rates, typically on the order of ¼ inch/hour, required.

BRIEF DESCRIPTION OF THE INVENTION

In accordance with the present invention, it has been found that the strength, especially at high temperatures, of single crystal superalloys of eutectic or near-eutectic composition can be significantly enhanced by thermally inducing the precipitation of dispersoids of a phase of the eutectic in the single crystal matrix subsequent to the solidification of the from the alloy melt. During solidification, growth of the dispersed phase is suppressed. The invention is particularly applicable to single crystal superalloys such as those having a predominantly nickel, iron or cobalt base and is particularly suited to the manufacture of articles, especially blades and vanes, for use in the very highest temperature regions of gas turbine engines. Such articles exhibit many of the desirable high temperature strength properties of the eutectic superalloys solidified, as has heretofore been done, to contain a fibrous reinforcing phase in the superalloy matrix, but are more economically attractive since slow growth rates are not required.

By the method of the invention, a eutectic or near-eutectic forming superalloy is selected; the alloy is directionally solidified to form a single crystal matrix at a rate sufficient to suppress the growth in the matrix of any discrete phases comprising the eutectic; and, thereafter, bringing the single crystal to a temperature and for a time sufficient to precipitate dispersoids of the previously suppressed phase(s).

The resultant product is a single crystal article having a superalloy matrix of eutectic or near-eutectic composition with a dispersion of at least one phase of the eutectic therein.

BRIEF DESCRIPTION OF THE DRAWINGS

FIG. 7 is a graph of rupture strength versus the Larson-Miller Parameter on which rupture strengths of alloys to the present invention are compared to those of a prior art commercially used superalloy.

DETAILED DESCRIPTION OF THE INVENTION

Figure 1:
FIG. 1 is a photomicrograph at 100X of a single crystal nickel-based superalloy of the invention containing dispersed TaC.

This invention relates to superalloys of eutectic or near-eutectic composition solidified as single crystals while the growth or precipitation of any discrete phase (or phases) of the eutectic is suppressed. Suppression of the growth of discrete phases in the matrix is essential since such phases form nucleation cites for additional grain growth thereby preventing growth of the single grain. To suppress such growth during solidification, alloy compositions are selected which are preferably hypo-eutectic or eutectic in composition, but generally not hyper-eutectic, and the single crystal matrix is solidified at a relatively rapid rate of about 4 to 20 inches or more an hour. Too rapid a rate will result in the inability to maintain growth as a single crystal. The resulting metastable solid solution single crystal is subsequently heated to a temperature sufficient to precipitate a dispersion of the previously suppressed phase of the eutectic into the matrix. An additional desirable, but not a necessary, requirement for achieving the dispersion in the single crystal matrix is that the crystal structure of the superalloy matrix and that of the suppressed phase be the same.

The dispersoids which are precipitated into the single crystal alloy matrix according to the invention are generally in the form of platelets rather than discrete fibers typically formed when these alloys are formed by planar front solidification. Such dispersoids contribute significantly to the strengthening of single crystal alloy structures, particularly at the high temperatures where these structures are frequently employed. Additionally, the dispersoid strengthened single crystals of the invention can be grown at a comparatively rapid rate thus making them economically attractive; as contrasted with the fiber strengthened eutectic alloys of the prior art.

Typical nickel-base superalloy compositions (in weight %) which are appropriate to the invention are the following:

| | NICKEL BASE | |
|---|---|---|
| | Preferred | Most Preferred |
| Aluminum | 4.0–8.0 | 5.5–6.5 |
| Chromium | 3.0–9.0 | 4.0–7.5 |
| Tungsten | 4.0–8.0 | 5.0–6.0 |
| Rhenium | 0–6.0 | 3.0–6.0 |
| Tantalum | 5.0–12.0 | 6.5–8.5 |
| Cobalt | 4.0–10.0 | 4.0–6.0 |
| Columbium | 0–2.0 | 0.5–1.5 |
| Molybdenum | 0–4.0 | 0.5–2.0 |
| Carbon | 0.1–0.5 | 0.15–0.25 |
| Boron | 0–0.04 | 0–0.02 |
| Zirconium | 0–0.2 | 0–0.1 |
| Hafnium | 0–1.0 | 0–0.2 |
| Titanium | 0–2.0 | 0–1.0 |
| Yttrium | 0–0.05 | 0–0.04 |
| Vanadium | 0–3.0 | 0–1.0 |

The balance being nickel and incidental impurities.

While described in terms of nickel-base superalloys, the invention is believed to be equally applicable to superalloys based on other elements, e.g., iron and cobalt-based superalloys.

Preferred dispersoids in accordance with the invention are carbides such as TaC, NbC, TiC, $Cr_2C_3$, $Cr_3C_7$, ZrC, HfC, ReC, WC and MoC or mixtures thereof. Additional useful dispersoids are molybdenum and $Ni_3Nb$.

Although the invention is described in terms of eutectic alloys and eutectoid reactions, it is presently anticipated that the present invention is also applicable to alloy systems exhibiting different transformation reactions, e.g., peritectic systems.

Some superalloys, exhibit a precipitation reaction which occurs in and strengthens the matrix. This reaction and its product are to be distinguished from the dispersoid precipitation reaction whose product is a dispersion of precipitates of one or more phases of the eutectic. The dispersoid reaction may be allowed to occur with the matrix strengthening reaction or, preferably, the reations may be caused to occur separately. To illustrate, a gamma/gamma prime hardened nickel-base eutectic superalloy having gamma and fiber-like (or rod-like) TaC as the continuous (matrix) and disrete equilibrium phases, respectively, of the eutectic, and which also exhibits a gamma prime reaction, is selected. Gamma prime will precipitate in the gamma matrix when the temperature drops below the gamma prime solvus temperature. This may occur while the single crystal is at an elevated temperature, e.g., at a distance remote from the solidification front, and most certainly upon cooling of the solidified single crystal to room temperature. In an unoptimized sequence, the single crystal is heated to a temperature (gamma prime solvus) sufficient to take the precipitated gamma prime into solution, at which temperature the dispersoid precipitation reaction will also occur. Thereafter, the supersaturated (with respect to gamma prime) matrix with the dispersoids is brought to the appropriate aging temperature and the gamma prime is precipitated into the gamma matrix. In some alloys, a second "aging" treatment is employed, at a lower temperature than the first, to precipitate additional amounts of gamma prime and to otherwise optimize the properties of the matrix.

In the optimized sequence, the dispersoid reaction is conducted first. Thereafter, the single crystal is heated to a different, generally higher, temperature sufficient to solution the gamma prime, cooled and subsequently aged at a lower temperature than the dispersoid reaction temperature. Since the time required to solution the gamma prime will be short, the more stable dispersoids will be little affected. An advantage to this optimized multi-step sequence is that the dispersoids are precipitated at the lowest possible temperature and, therefore, are finer than if precipitated at the higher gamma prime solutioning temperature.

In order that those skilled in the art will be better able to practice the invention, the following examples are given by way of illustration and not by way of limitation.

EXAMPLE 1

Single crystals were grown from a stoichiometric eutectic melt having the composition (in weight percent): 4.0% Cr, 4.0% Co, 5.5% Al, 4.5% W, 6.0% Re, 8.4% Ta, 0.03% B, 3.0% Mo, 0.23% C, balance Ni and incidental impurities (Alloy 900, Table I). The single crystals were grown at rates of 8" per hr., 14" per hr., 16" per hr. and 20" per hr. without any eutectic reaction occurring. The single crystals were next thermally treated at 2375° F. for 4 hours to solution the gamma prime phase and to cause the eutectoid reaction. The alloy was subsequently aged at 1975° F. for 16 hours and at 1650° F. for 16 hours to precipitate the gamma prime phase. During the 2375° F./4 hours gamma prime solution treatment and also during cooling from the solution temperature, the MC carbide dispersoids were precipitated.

Figure 3:
FIG. 3 is the superalloy of the FIG. 1 with the dispersed TaC dispersoids shown at 1000x.

These MC carbide dispersoids are shown in the photomicrographs of FIGS. 1 (100x) and 2 (500x). FIG. 3 is a higher magnification (1000x) scanning

TABLE I

ALLOY COMPOSITIONS (weight percent)

| Alloy* | Co | Cr | Al | Ti | W | Mo | Re | Ta | Cb | C | B |
|---|---|---|---|---|---|---|---|---|---|---|---|
| 900 | 4.0 | 4.0 | 5.5 | 0 | 4.5 | 3.0 | 6.0 | 8.4 | 0 | 0.23 | 0.03 |
| 901 | 4.0 | 4.0 | 5.5 | 0 | 4.5 | 3.0 | 3.0 | 8.4 | 0 | 0.23 | 0.03 |
| 902** | 7.5 | 7.0 | 6.2 | 0 | 6.0 | 1.5 | 3.0 | 10.0 | 0 | 0.23 | 0.03 |
| 909*** | 4.0 | 4.0 | 6.2 | 1.0 | 4.5 | 2.0 | 6.0 | 8.5 | 0.5 | 0.23 | 0.03 |
| 918 | 4.0 | 4.0 | 6.0 | 0 | 4.5 | 3.0 | 6.0 | 8.4 | 0 | 0.23 | 0.03 |
| 919 | 4.0 | 4.0 | 6.2 | 0 | 4.5 | 3.0 | 6.0 | 8.4 | 0 | 0.23 | 0.03 |
| 920 | 4.0 | 4.0 | 6.0 | 0 | 4.5 | 3.0 | 6.0 | 8.4 | 0.5 | 0.23 | 0.03 |
| 922 | 7.0 | 7.0 | 6.2 | 0 | 6.0 | 1.5 | 3.0 | 6.5 | 0 | 0.23 | 0.03 |
| Commercial Single Crystal | 5.0 | 10.0 | 5.0 | 1.5 | 4.0 | 0 | 0 | 12.0 | 0 | 0 | 0 |

Figure 2:
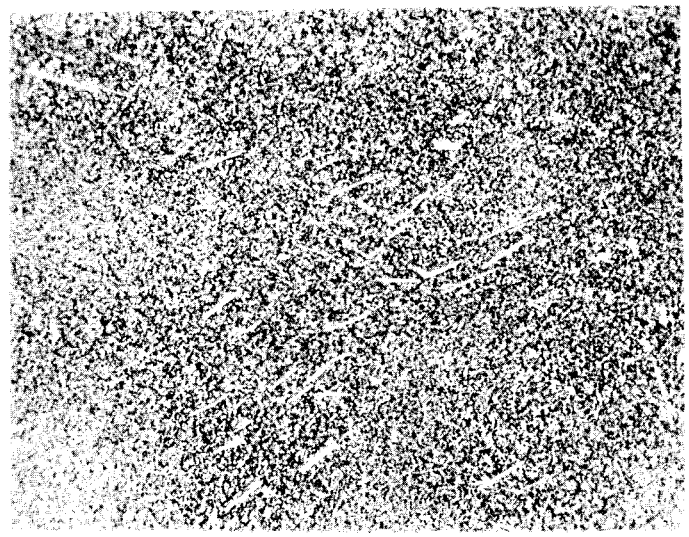
FIG. 2 is the superalloy of FIG. 1 at 500x.
Figure 4:
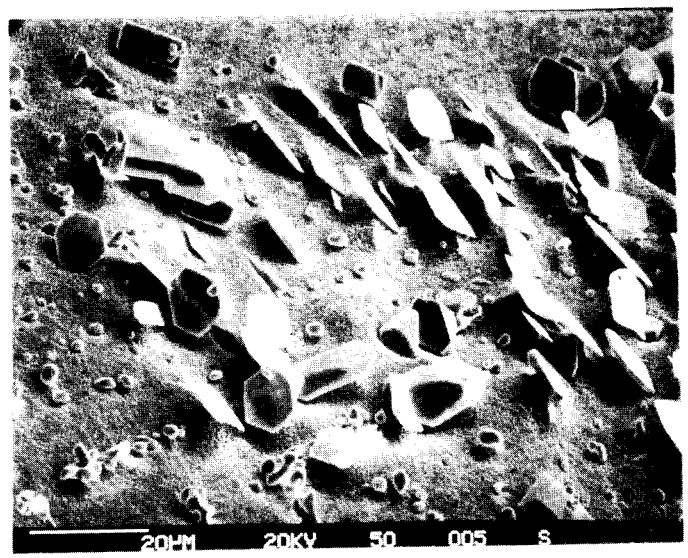
FIG. 4 is a scanning electron photomicrograph of the superalloy of FIG. 1 showing the monocarbide dispersoids at 1000× in relief.
Figure 5:
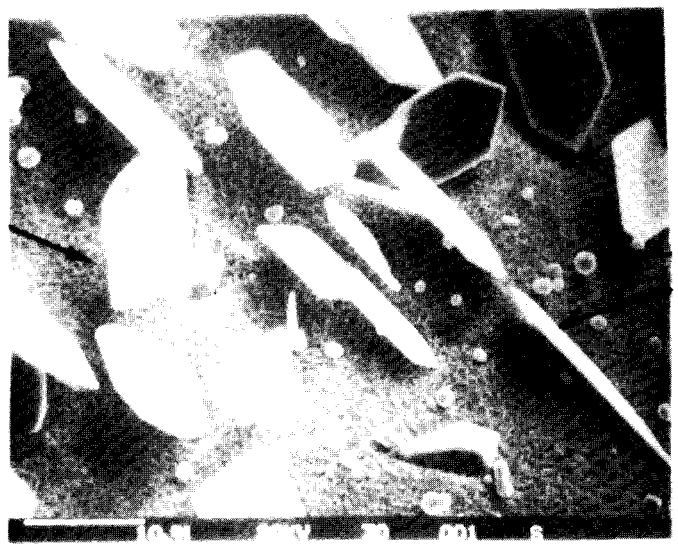
FIG. 5 is a scanning electron photomicrograph of the superalloy of FIG. 1 showing carbide dispersoids in an area different from that of FIG. 4 at 2000×.

*balance nickel including incidental impurities
**plus 0.04 Y
***plus 0.15 Hf, 0.03 Zr, and 0.04 Y electron photomicrograph of the carbide dispersoids of the single crystal alloy of FIGS. 1 and 2. In this micrograph, two different shapes of dispersoid are shown. The shapes of the dispersoids in FIG. 3 are more clearly revealed in the scanning electron photomicrograph of FIG. 4. In FIG. 4 (1000x), the carbide dispersoids are shown in relief obtained by first electrolytically etching the gamma/gamma prime matrix. The platelet-shaped dispersoids were identified, by energy dispersive spectroscopy, selected area diffraction, and X-ray diffraction techniques, as tantalum carbide containing small amounts of Mo, Re and W. Similarly, the spherical-shaped dispersoids were identified as essentially pure tantalum carbide. FIG. 5 is a still higher magnification (2000x) scanning electron photomicrograph of the superalloy in FIG. 4 showing carbide dispersoids in an area different than that shown in FIG. 4.

EXAMPLE 2

Figure 6:
FIG. 6 is a photomicrograph at 1000X of a nickel-based superalloy of the invention different from that of FIG. 1 with dispersed MC carbides.

FIG. 6 is a photomicrograph (1000x) of carbide dispersoids in a nickel-base single crystal alloy also prepared in accordance with the invention and Example 1 (growth rate of 12 inches/hr) and having the composition: 4.0% Cr, 5.5% Al, 8.4% Ta, 4.0% Co, 4.5% W, 3.0% Mo, 3.0% Re, 0.23% C, 0.03% B, balance Ni and incidental impurities (Alloy 901, Table I). The single crystal superalloy of this Example contains only spherical-shaped carbide dispersoids. The change in the dispersoid shape in this superalloy was brought about by a change in the chemical composition of the superalloy. This example illustrates the versatility of the invention to obtain eutectoid dispersoids of various compositions and morphologies by changes in the chemical composition of the superalloy and/or the processing conditions.

EXAMPLE 3

Table I lists the compositions of the alloys prepared in single crystal form in accordance with this invention.

Also listed is the composition of a prior art single crystal alloy currently used as a blade material in gas turbine engines.

Following growth as single crystals at a growth rate of 8 inches/hr as described in Example 1, alloy 902 in Table I was solutioned at 2375° F. for 4 hours, alloy 909 was solutioned at 2350° F. for 8 hours, alloys 918 and 919 were solutioned at 2340° F. for 6 hours and alloys 920 and 922 were solutioned at 2340° F. for 4 hours. All these alloys were subsequently aged at 1975° F. and 1650° F. for 16 hours at each of the aging temperatures. All of these alloys showed carbide dispersoids in a single crystal gamma plus gamma prime matrix.

EXAMPLE 4

Alloy 900 of Table I was tested for tensile properties at 1600° F. and 1800° F. The test results are shown in Table II.

TABLE II

| | TENSILE PROPERTIES OF ALLOYS | | | |
|---|---|---|---|---|
| Alloy | Temperature °F. | 0.2% Yield Strength | Ultimate Tensile Strength | % Reduction in Area |
| 900 | 1600 | 131.7 | 145.5 | 4.9 |
| 900 | 1800 | 100.0 | 112.1 | 12.1 |
| Commercial Single Crystal | 1600 | 130.0 | 145.0 | 22.0 |
| Commercial Single Crystal | 1800 | 62.0 | 97.0 | 18.0 |

The dispersion strengthened single crystal alloy 900 is equivalent to or superior to the commercial alloy in yield and ultimate tensile strengths. The ductility of alloy 900, as measured by the percent reduction in area during the tensile tests, though lower than the commerical alloy, is more than adequate for use in gas turbine engines.

EXAMPLE 5

The stress-rupture properties of some of the alloys prepared in Example 3 were measured. The test conditions and results are listed in Table III.

TABLE III

| STRESS RUPTURE LIVES OF ALLOYS | | |
|---|---|---|
| Alloy | Test Condition | Life in Hours |
| 900 | 1600° F./80 KSI | 115.6 |
| 900 | 1800° F./30 KSI | 359.8 |
| 900 | 1800° F./40 KSI | 103.9 |
| 900 | 2000° F./15 KSI | 174.4 |
| 902 | 1800° F./40 KSI | 48.9 |
| 902 | 2000° F./20 KSI | 37.1 |
| 918 | 1800° F./40 KSI | 51.9 |
| 918 | 2000° F./20 KSI | 24.2 |
| 919 | 1800° F./40 KSI | 42.8 |
| 919 | 2000° F./20 KSI | 36.4 |
| 922 | 1600° F./80 KSI | 114.4 |
| 922 | 1800° F./40 KSI | 79.0 |
| 922 | 2000° F./20 KSI | 59.1 |

The stress rupture lives of the dispersion strengthened single cyrstal alloys of the present invention shown in Table II are plotted on a Larson-Miller parameter plot in FIG. 7 to compare their lives with the prior art commercial single crystal alloy.

It is clear from Table 3 and FIG. 7 that the single crystal alloys of the present invention achieve a 50–100° F. strength advantage over prior art superalloys strengthened only by the gamma prime phase and, therefore, are particularly useful in applications which require materials that retain high strength at high operating temperatures, such as airfoils, exhaust components, seals and turbine blade tips of gas turbine engines.

While the present invention has been described with reference to particular embodiments and compositions thereof, it will be understood that numerous modifications and alterations can be made by those skilled in the art without departing from the scope of the invention or the appended claims.

What is claimed is:

1. A method for producing a strengthened single crystal article comprising the steps of:
   (a) selecting a eutectic-forming superalloy;
   (b) directionally solidifying said superalloy to form a single crystal matrix at a rate sufficient to suppress the growth in the matrix of any discrete phases comprising the eutectic; and
   (c) bringing said directionally solidified single crystal to a temperature and for a time sufficient to precipitate in the single crystal matrix dispersoids of at least one of the previously suppressed discrete phase or phases.

2. The method of claim 1 wherein said superalloy is a nickel-based superalloy.

3. The method of claim 2 wherein the phases of said eutectic are gamma and a monocarbide.

4. The method of claim 3 wherein the supressed phase is the monocarbide.

5. The method for producing a strengthened single crystal article comprising the steps of:
   (a) selecting a eutectic-forming superalloy, said superalloy also having a matrix strengthening phase;
   (b) directionally solidifying said superalloy to form a single crystal matrix at a rate sufficient to suppress the growth in the matrix of any discrete phases comprising the eutectic;
   (c) heating said single crystal to a temperature above the solvus temperature of said matrix strengthening phase;
   (d) maintaining said single crystal at the temperature in step (c) for a time sufficient to solution any matrix strengthening phase present an to precipitate in the single crystal matrix dispersoids of at least one previously suppressed discrete phaes or phases; and
   (e) heating said single crystal to at least a first temperature sufficient to precipitate said matrix strengthening phase is said matrix.

6. The method of claim 5 further including the step of heating said single crystal to a second temperature, lower than said first temperature, to precipitate additional amounts of said matrix strengthening phase.

7. A method for producing a strengthened single crystal article, comprising the steps of:
   (a) selecting a eutectic-forming superalloy, said superalloy also having a matrix strengthening phase;
   (b) directionally solidifying said superalloy to form a single crystal matrix at a rate sufficient to suppress the growth in the matrix of any discrete phases comprising the eutectic;
   (c) heating said single crystal to a temperature and for a time sufficient to precipitate in the single crystal matrix dispersoids of at least one previously suppressed discrete phase or phases;
   (d) heating said single crystal to a temperature above the solvus temperature of said matrix strengthening phase for a time sufficient to solution any matrix strengthening phase present; and (e) heating said single crystal to at least a first temperature sufficient to precipitate said matrix strengthening phase in said matrix.

8. The method of claim 7 further including the step of heating said single crystal to a second temperature, lower than said first temperature, to precipitate additional amounts of said matrix strengthening phase.

9. A method for producing a strengthened single crystal article, comprising the steps of:
   (a) selecting a eutectic-forming nickel-base superalloy, said eutectic having at least a discrete and a continuous phase;
   (b) directionally solidifying said superalloy to form a single crystal matrix at a rate sufficient to suppress the growth in the matrix of any discrete phase comprising the eutectic; and
   (c) bringing said directionally solidified single crystal to a temperature and for a time sufficient to precipitate in the single crystal matrix dispersoids of at least one of the previously suppressed discrete phase or phases.

10. A method for producing a strengthened single crystal article, comprising the steps of:
    (a) selecting a eutectic-forming nickel-base superalloy, said eutectic having at least a discrete and a continuous phase, said superalloy also having a matrix-strengthening phase; and
    (b) directionally solidifying said superalloy to form a single crystal matrix at a rate sufficient to suppress the growth in the matrix the any discrete phases comprising the eutectic.

11. The method of claim 10, further including the steps of:
    (a) heating said single crystal to a temperature above the solvus temperature of said matrix strengthening phase;
    (b) maintaining said single crystal at the temperature in step (a) for a time sufficient to solution any matrix strengthening phase present and to precipitate in the single crystal matrix dispersoids of at least one previously suppressed discrete phase or phases; and
    (c) heating said single crystal to at least a first temperature sufficient to precipitate said matrix strengthening phase in said matrix.

12. The method of claim 11, further including the step of heating said single crystal to a second temperature, lower than said first temperature, to precipitate additional amounts of said matrix strengthening phase.

13. The method of claim 10, further including the steps of:
    (a) heating said single crystal to a temperature and for a time sufficient to precipitate in the single crystal matrix dispersoids of at least one of said previously suppressed discrete phase or phases;
    (b) heating said single crystal to a temperature above the solvus temperature of said matrix strengthening phase for a time sufficient to solution any matrix strengthening phase present; and
    (c) heating said single crystal to at least a first temperature sufficient to precipitate said matrix strengthening phase in said matrix.

14. The method of claim 13, further including the step of heating said single crystal to a second temperature, lower than said first temperature, to precipitate additional amounts of said matrix strengthening phase.

15. The method of claim 10 wherein said rate is in the range from about 4 to 20 inches per hour.

16. The method of claim 10 wherein said superalloy consists essentially of about (in weight percent): 4.0–8.0 Al, 3.0–9.0 Cr, 4.0–8.0 W, 0–6.0 Re, 5.0–12.0 Ta, 4.0–10.0 Co, 0–2.0 Cb, 0–4.0 Mo, 0.1–0.5 C, 0–0.04 B, 0–0.2 Zr, 0–1.0 Hf, 0–2.0 Ti, 0–0.05 Y, 0–3.0 V, the balance nickel plus incidental impurities.

17. The method of claim 16 wherein said superalloy consists essentially of about (in weight percent): 5.5–6.5 Al, 4.0–7.5 Cr, 5.0–6.0 W, 3.0–6.0 Re, 6.5–8.5 Ta, 4.0–6.0 Co, 0.5–1.5 Cb, 0.5–2.0 Mo, 0.15–0.25 C, 0–0.02 B, 0–0.1 Zr, 0–0.2 Hf, 0–1.0 Ti, 0–0.04 Y, 0–1.0 V, the balance nickel plus incidental impurities.

18. An article of a eutectic-forming superalloy, said eutectic having at least two phases, said article comprising a single crystal matrix of one phase of said eutectic and a dispersion in said matrix of at least the other phase of said eutectic.

19. The article of claim 18 in the form of a gas turbine engine component.

20. The article of claim 19 wherein said component is a blade.

21. The article of claim 19 wherein said component is a vane.

22. An article made by the process of claim 1.

23. The article of claim 18 having a composition consisting essentially of about (in weight percent): 4.0–8.0 Al, 3.0–9.0 Cr, 4.0–8.0 W, 0–6.0 Re, 5.0–12.0 Ta, 4.0–10.0 Co, 0–2.0 Cb, 0–4.0 Mo, 0.1–0.5 C, 0–0.04 B, 0–0.2 Zr, 0–1.0 Hf, 0–2.0 Ti, 0–0.05 Y, 0–3.0 V, the balance nickel plus incidental impurities.

24. The article of claim 23 having a composition consisting essentially of about (in weight percent): 5.5–6.5 Al, 4.0–7.5 Cr, 5.0–6.0 W, 3.0–6.0 Re, 6.5–8.5 Ta, 4.0–6.0 Co, 0.5–1.5 Cb, 0.5–2.0 Mo, 0.15–0.25 C, 0–0.02 B, 0–0.1 Zr, 0–0.2 Hf, 0–1.0 Ti, 0–0.04 Y, 0–1.0 V, the balance nickel plus incidental impurities.

25. The article of claim 18 in which the dispersion generally is in a shape selected from the group consisting of platelets, spheroids and their mixtures.

26. A single crystal eutectic alloy article including dispersed, discrete dispersoids generally in a shape selected from the group consisting of platelets, spheroids and their mixtures.

27. The article of claim 26 in which the dispersoids are metal carbides.

* * * * *